United States Patent
Kurashima et al.

(10) Patent No.: US 7,655,559 B2
(45) Date of Patent: Feb. 2, 2010

(54) POST-CMP TREATING LIQUID AND MANUFACTURING METHOD OF SEMICONDUCTOR DEVICE USING THE SAME

(75) Inventors: Nobuyuki Kurashima, Yokohama (JP); Gaku Minamihaba, Yokohama (JP); Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 277 days.

(21) Appl. No.: 11/552,200

(22) Filed: Oct. 24, 2006

(65) Prior Publication Data
US 2007/0190770 A1 Aug. 16, 2007

(30) Foreign Application Priority Data
Feb. 16, 2006 (JP) ............................. 2006-039363

(51) Int. Cl.
H01L 21/20 (2006.01)
(52) U.S. Cl. ................. 438/637; 438/639; 438/691; 438/693; 257/E21.585
(58) Field of Classification Search ......... 438/637–639, 438/691–693; 257/E21.242, E21.585
See application file for complete search history.

(56) References Cited
U.S. PATENT DOCUMENTS

| | | | |
|---|---|---|---|
| 6,375,545 B1 * | 4/2002 | Yano et al. .......... 451/36 |
| 6,579,153 B2 * | 6/2003 | Uchikura et al. .......... 451/41 |
| 6,831,048 B2 * | 12/2004 | Kezuka et al. .......... 510/175 |
| 6,858,539 B2 | 2/2005 | Minamihaba et al. |
| 7,402,521 B2 * | 7/2008 | Matsui et al. .......... 438/692 |
| 2003/0157806 A1 * | 8/2003 | Nagahara et al. .......... 438/694 |
| 2003/0216270 A1 | 11/2003 | Abe et al. |
| 2004/0106531 A1 * | 6/2004 | Kanno et al. .......... 510/175 |
| 2007/0128873 A1 * | 6/2007 | Minamihaba et al. .......... 438/692 |
| 2008/0216415 A1 * | 9/2008 | Kurashima et al. .......... 51/298 |

OTHER PUBLICATIONS

U.S. Appl. No. 11/967,584, filed Dec. 31, 2007, Kurashima, et al.

* cited by examiner

*Primary Examiner*—Michael S Lebentritt
(74) *Attorney, Agent, or Firm*—Oblon, Spivak, McClelland, Maier & Neustadt, L.L.P.

(57) ABSTRACT

A post CMP treating liquid is provided, which includes water, resin particles having, on their surfaces, carboxylic group and sulfonyl group, and a primary particle diameter ranging from 10 to 60 nm, a first surfactant having carboxylic group, a second surfactant having sulfonyl group, and tetramethyl ammonium hydroxide. The resin particles are incorporated at a concentration ranging from 0.01 to 1 wt %. The treating liquid has a pH ranging from 4 to 9, and exhibits a polishing rate both of an insulating film and a conductive film at a rate of 10 nm/min or less.

9 Claims, 1 Drawing Sheet

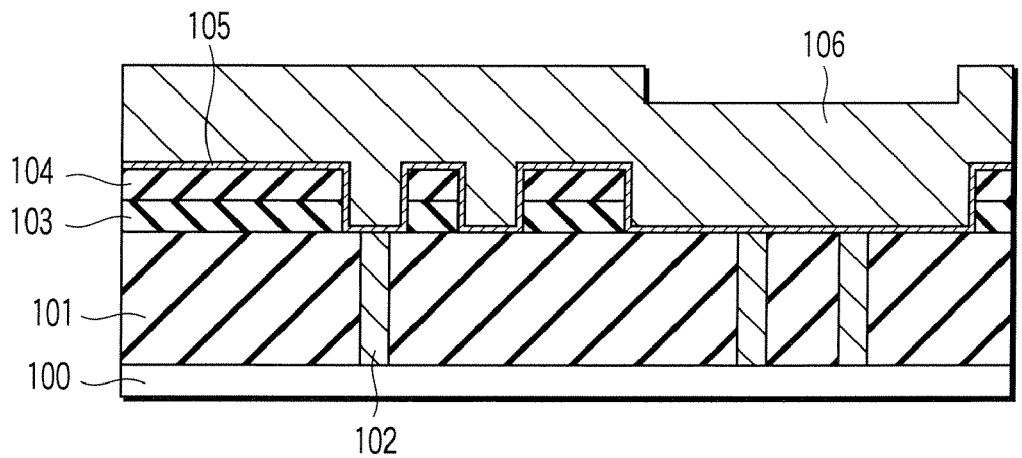
F I G. 1A
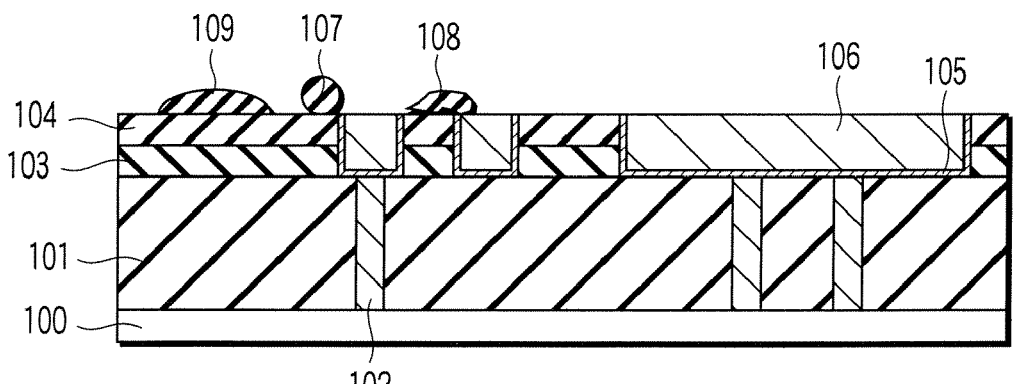
F I G. 1B
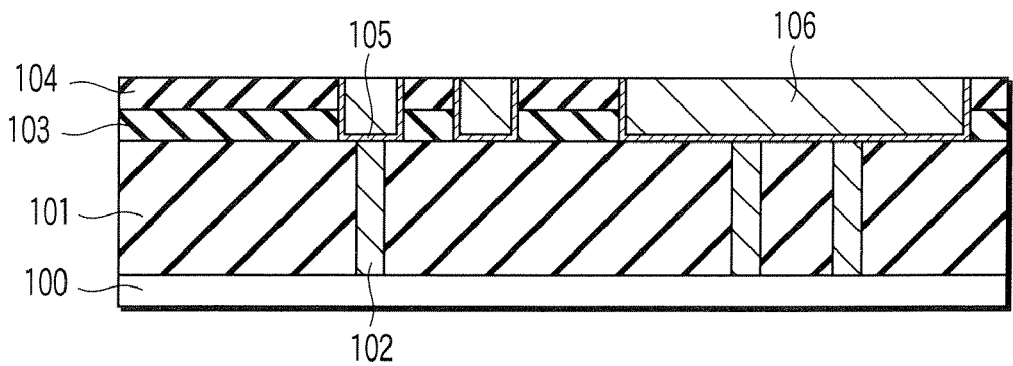
F I G. 1C

POST-CMP TREATING LIQUID AND MANUFACTURING METHOD OF SEMICONDUCTOR DEVICE USING THE SAME

CROSS-REFERENCE TO RELATED APPLICATIONS

This application is based upon and claims the benefit of priority from prior Japanese Patent Application No. 2006-039363, filed Feb. 16, 2006, the entire contents of which are incorporated herein by reference.

BACKGROUND OF THE INVENTION

1. Field of the Invention

This invention relates to a treating liquid to be used after finishing chemical mechanical polishing (CMP) and to a method of manufacturing a semiconductor device using the treating liquid.

2. Description of the Related Art

In recent years, a trend to further promote the fineness of wiring has been rapidly advanced concomitant with a trend to further promote the integration of an LSI. Additionally, it is now considered imperative to adopt new materials for alleviating the delay of wiring RC. Under the circumstances, it is now being attempted to employ low resistance Cu ($\rho$: 1.8 $\mu\Omega$cm) as a conductive material and to employ an insulating film of low dielectric constant (k: <2.5) as an insulating material.

The Cu wiring is mainly formed as damascene wiring by CMP. The insulating film and wiring that have been formed by CMP are inevitably accompanied with residues such as dusts (abrasive particles and shavings) and unreacted slurry. As the washing liquid to removing these residues, there have been conventionally employed those containing a chelate complexing agent and a surfactant. However, since intervals between wirings is required to be as small as 0.1 $\mu$m or less in a semiconductor device of the next generation, a trace amount of fine residues that has been considered to raise no problems up to date may cause wiring failures such as short-circuit between wirings or the deterioration in withstanding voltage of insulating film as the space between wirings is further narrowed in future.

Additionally, since most of the insulating films of low dielectric constant contain an organic component, the surface of the film is hydrophobic and hence hardly wettable to water. Therefore, dust easily adsorbs on the surface of insulating film during the CMP treatment or the washing treatment. Moreover, the dust once adsorbed in this manner can be hardly removed, thus giving rise to failures to form wirings which are normally electrically isolated from each other. Further, the insulating film having a low dielectric constant is also accompanied with a problem that it can be easily scratched.

As the washing liquid to be employed for removing minute particles and metal impurities which are adhered to the surface of substrate, there has been conventionally proposed a treating liquid containing aliphatic polycarboxylic acid and a reducing agent. Further, there has been also proposed a treating liquid containing resin particles for performing a post-CMP treatment. However, although the surface of the insulating film in which a conductive material is buried, in particular, the surface of the insulating film having a low dielectric constant is demanded to be more clean after finishing the CMP treatment thereof, the conventional treating liquids are now found increasingly difficult to sufficiently meet such a demand at present.

BRIEF SUMMARY OF THE INVENTION

A post CMP treating liquid according to one aspect of the present invention comprises water; resin particles having, on their surfaces, carboxylic group and sulfonyl group, and a primary particle diameter ranging from 10 to 60 nm, the resin particles being incorporated at a concentration ranging from 0.01 to 1 wt %; a first surfactant having carboxylic group; a second surfactant having sulfonyl group; and tetramethyl ammonium hydroxide; the treating liquid having a pH ranging from 4 to 9 and exhibiting a polishing rate both of an insulating film and a conductive film at a rate of 10 nm/min or less.

A method for manufacturing a semiconductor device according to another aspect of the present invention comprises depositing a conductive material above an insulating film formed above a semiconductor substrate and having a recess, thereby forming a conductive film; polishing the conductive film to expose a surface of the insulating film while burying the conductive material in the recess, thereby forming a buried wiring layer; and treating a surface of the buried wiring layer and the surface of the insulating film using a treating liquid without substantially polishing these surfaces, the treating liquid comprising water; resin particles having, on their surfaces, carboxylic group and sulfonyl group, and a primary particle diameter ranging from 10 to 60 nm, the resin particles being incorporated at a concentration ranging from 0.01 to 1 wt %; a first surfactant having carboxylic group; a second surfactant having sulfonyl group; and tetramethyl ammonium hydroxide; the treating liquid having a pH ranging from 4 to 9.

BRIEF DESCRIPTION OF THE SEVERAL VIEWS OF THE DRAWING

FIGS. 1A to 1C are cross-sectional views each illustrating a step in the manufacturing method of a semiconductor device according to one embodiment of the present invention.

DETAILED DESCRIPTION OF THE INVENTION

It has been observed by the present inventors that the removal of dust, etc., which remains on the surface of wiring layer immediately after CMP treatment, is conventionally achieved by a combination of four basic factors, i.e., dissolution, chemical action, mechanical action and surface activity. For example, a treating liquid containing a chelate complexing agent for providing chemical action, a surfactant for effecting surface activity, and pure water for effecting dissolution is applied to polish the surface of an object by a polishing pad, thereby applying mechanical action to the surface.

When an insulating film having a low dielectric constant (k: <2.5) is employed as an insulating material, the porosity thereof is increased and the mechanical strength thereof is lowered as compared with the ordinary insulating film. Therefore, the treating liquid to be employed and the method for washing are required to be suitably selected taking these features into consideration. Moreover, since defects which are peculiar to the insulating film having a low dielectric constant would be generated, additional new countermeasures are required to be developed. More specifically, when a wafer is dried non-uniformly, liquid containing impurities may be left behind as a water mark on the insulating film. As a result, the yield would be decreased due to short circuit between wirings, etc.

In view of these problems, a post-CMP treating liquid according one embodiment of the present invention comprises resin particles having two kinds of functional group, two kinds of surfactants, and a basic compound. Moreover, the primary particle diameter and concentration of the resin particles as well as the pH of the treating liquid are confined respectively to predetermined ranges. The treating liquid satisfying these conditions is capable of removing residues remaining on the surface of insulating film irrespective of the kinds of insulating film. Namely, this treating liquid exhibits excellent washing effects not only on the surface of the insulating film of low dielectric constant to be treated but also on the surface of the ordinary insulating film to be treated.

In the embodiment of the present invention, the intention is to remove residues from the surfaces of wiring layer and insulating film, the insulating film made of a material such as $SiO_2$ and the conductive film made of a material such as Cu and Ta are not required to be polished. On the contrary, in order to inhibit the polishing of these insulating film and conductive film in a treatment using the treating liquid according to one embodiment of the present invention, the polishing rate of these insulating film and conductive film by the treating liquid according to one embodiment of the present invention is confined to 10 nm/min or less. Irrespective of the treating conditions, the kinds of these insulating film and conductive film, as long as the polishing rate of these insulating film and conductive film is confined to 10 nm/min or less, these films are assumed not to be polished to any substantial degree, thereby making it possible to exclusively obtain desired washing effects.

As the materials for the resin particles, it is possible to employ, for example, poly(methyl methacrylate) (PMMA), polystyrene (PS), polyethylene (PE), polyethylene glycol, polyvinyl acetate, polybutadiene, polyisobutylene, polypropylene and polyoxymethylene. The resin particles may be formed solely of a single kind of material or formed of a combination of two or more kinds of these resins.

The surfaces of the resin particles are constructed to have two kinds of functional groups, i.e., carboxylic group and sulfonyl group bonded thereto. Due to the existence of these functional groups, chelate effect is created between the resin particles and a metal such as Cu, etc., thereby enabling residues including metals to be effectively removed. These carboxylic group and sulfonyl group are capable of generating anions ($-COO^-$ and $SO_3^-$) in the treating liquid. As compared with cations, the anions are advantageous in the respects that they are excellent in safety and low in manufacturing cost.

The primary particle diameter of the resin particles is confined within the range of 10 to 60 nm. The primary particle diameter of the resin particles can be measured from the SEM or TEM photograph thereof. When the primary particle diameter of the resin particles is less than 10 nm, the quantities of these two kinds of functional groups on the surface of resin particles may become insufficient, thus making it impossible to obtain the effects thereof. On the other hand, when the primary particle diameter of the resin particles exceeds 60 nm, it may become impossible to completely remove the water mark generated on the hydrophobic surface of insulating film. Moreover, the resin particles themselves may remain on the treated surface, rendering them to become a cause for generating the defects. More preferably, the primary particle diameter of the resin particles should be confined within the range of 30 to 50 nm.

The concentration of the resin particles in the post-CMP treating liquid should be confined within the range of 0.01 to 1 wt %. If the resin particles are contained in the post-CMP treating liquid at a concentration exceeding 1 wt %, the resin particles themselves leave behind after the drying process of wiring layer, thus generating new defects and hence badly affecting the semiconductor device. Additionally, the manufacturing cost of the treating liquid itself would be increased. On the other hand, if this concentration of the resin particles is less than 0.01 wt %, it may become impossible to completely remove the water mark. More preferably, the concentration of the resin particles should be confined within the range of 0.05 to 0.1 wt %.

As the first surfactant having carboxylic group, it is possible to employ polyacrylic acid, polyacrylate, polymethacrylic acid, polymethacrylate, acrylic acid-methacrylic acid and acrylic acid-methacrylate. Polyhydric carboxylic acid-based copolymers may be used as the first surfactant. The weight average molecular weight of this first surfactant should preferably be confined within the range of 2000 to 20000. If the weight average molecular weight of this first surfactant is less than 2000, it may become difficult to derive a sufficient washing power from the surfactant. On the other hand, if the weight average molecular weight of this first surfactant exceeds 20000, the surfactant may be aggregated with the resin particles or the viscosity of the treating liquid may become excessively high.

As already explained above, the resin particles are provided, on their surfaces, with two kinds of functional groups, i.e., carboxyl group and sulfonyl group. As the carboxyl group representing one of these functional groups is contained also in the first surfactant, the chelate effects as described above can be further enhanced. As a result, the effect to remove the aforementioned water mark can be further promoted.

The effects of the first surfactant can be sufficiently exhibited as long as the amount thereof is at least 0.01 wt % or more based on a total weight of the treating liquid. However, even if this first surfactant is incorporated excessively higher than this amount, the effects thereof may not be proportionally enhanced. On the contrary, when this first surfactant is incorporated excessively, there may be raised a problem that aggregation generates between the first surfactant and the resin particles. In view of this, it is preferable to set the upper limit of the amount of the first surfactant to 1 wt %.

Incidentally, the first surfactant should more preferably be selected from polyacrylic acid, poly(potassium acrylate) and poly(ammonium acrylate), since these polymers are featured in that they are formed of a straight chain, that the weight average molecular weight thereof is confined within a suitable range, and that most of the carboxyl groups thereof are coordinated to the surface thereof.

As the second surfactant having sulfonyl group, it is possible to employ alkyl benzene sulfonate such, for example, as hexyl benzene sulfonate, octyl benzene sulfonate, dodecyl benzene sulfonate, tetradecyl benzene sulfonate, hexadecyl benzene sulfonate and octadecyl benzene sulfonate.

Since the carboxyl group among the carboxyl group and the sulfonyl group existing on the surface of the resin particles is contained in the first surfactant, the chelate effects can be further enhanced as described above. Since the sulfonyl group representing the other functional group existing on the surface of the resin particles is contained in the second surfactant, the chelate effects can be enhanced likewise and hence the effect to remove the aforementioned water mark can be further promoted.

Because of the same reason as explained with reference to the first surfactant, the amount of the second surfactant should preferably be confined within the range of 0.01 to 1 wt % based on a total weight of the treating liquid.

Incidentally, the second surfactant should more preferably be selected from potassium dodecyl benzene sulfonate and ammonium dodecyl benzene sulfonate, since these sulfonates are featured in that the weight average molecular weight thereof is confined within a suitable range, that they are formed of a straight chain and contain benzene ring, and that most of the sulfonyl group thereof is coordinated to the surface thereof.

The post-CMP treating liquid according one embodiment of the present invention contains tetramethyl ammonium hydroxide (TMAH) in addition to the aforementioned components. Since this TMAH is one of basic compounds, it is capable of dissolving a complex of the wiring material formed of a metal such as Cu. Moreover, by suitably controlling the amount of this TMAH, the pH of the post-CMP treating liquid can be suitably adjusted.

Incidentally, compounds such as ethylene diamine and trimethyl hydroxyethyl ammonium hydroxide (choline) may be included in the scope of the aforementioned basic compound. Even when these compounds are incorporated in the post-CMP treating liquid, the pH of the post-CMP treating liquid can be adjusted to the range of 4 to 9. However, in the case of a treating liquid containing ethylene diamine for example, the surface of the wiring material formed of a metal such as Cu may be etched. A basic compound which is capable of adjusting the pH of the post-CMP treating liquid without raising any problems and also dissolving a complex of a metal such as Cu will be limited to aforementioned TMAH.

As the amount of the TMAH, there is not any particular limitation and hence can be suitably selected from the range which enables to adjust the pH of the post-CMP treating liquid to the range of 4 to 9.

When the pH of the post-CMP treating liquid is less than 4, it may become difficult to remove the resin particles. On the other hand, when the pH of the post-CMP treating liquid is higher than 9, there may be raised a problem that the surface of the wiring is roughened. In order to avoid these problems, the pH of the post-CMP treating liquid according to one embodiment of the present invention is regulated to the range of 4 to 9.

The components described above are mixed with water to obtain a post-CMP treating liquid according to one embodiment of the present invention. As water, it is possible to employ ion-exchange water, pure water, etc., without any particular limitation.

The post-CMP treating liquid according to one embodiment of the present invention may further contain a reducing agent. As the reducing agent, it is possible to employ hydroxylamine for example. When the pH of the treating liquid is relatively high, e.g., 8 to 9, the effect of suppressing the corrosion of a metal such as Cu can be further enhanced by the inclusion of the reducing agent. As the amount of the reducing agent, there is not any particular limitation. When the amount of the reducing agent is 0.01 wt % or more based on a total weight of the treating liquid, the aforementioned effect can be secured. However, when the reducing agent is excessively incorporated in the treating liquid, problems such as the precipitation of wiring materials may occur. Therefore, it is preferable to set the upper limit of the reducing agent to about 1 wt % based on a total weight of the treating liquid.

The treating liquid as described above is fed to the surface of object after finishing the CMP thereof and at the same time, mechanical action is applied to the surface using a suitable member such as a polishing pad, rolls or pencil, thereby removing residual matters from the surfaces of wiring layer and insulating layer, thus obtaining a semiconductor device excellent in electric properties.

Next, one example for forming a Cu damascene wiring by the method according to one embodiment of the present invention will be explained.

FIGS. 1A to 1C are cross-sectional views each illustrating a step in the method according to one embodiment of the present invention.

First of all, as shown in FIG. 1A, a barrier metal film 105 and a wiring material film 106 are successively formed, via an inorganic insulating film 101 and laminated insulating films 103 and 104, on a semiconductor substrate 100 having elements (not shown) formed therein.

In the inorganic film 101, plugs 102 made of W (tungsten) are buried. The laminated insulating films are constituted by a first insulating film 103 having a relative dielectric constant of less than 2.5, and a second insulating film 104 having a higher relative dielectric constant than that of the first insulating film 103. The film thickness of the first insulating film as well as of the second insulating film may be 100 nm.

The first insulating film 103 may be formed of at least one selected from the group consisting of a film having a siloxane skeleton such as polysiloxane, hydrogen silsesquioxane, polymethyl siloxane and methylsilsesquioxane; a film formed, as a major component, of an organic resin such as polyarylene ether, polybenzoxazole and polybenzocyclobutane; and a porous film such as a porous silica film. The first insulating film made of these materials is fragile.

The second insulating film 104 to be formed on the first insulating film 103 acts as a capping insulating film and can be formed by at least one insulating material having a relative dielectric constant of 2.5 or more and selected from the group consisting, for example, of SiC, SiCH, SiCN, SiOC, SiN and SiOCH. The surface of the second insulating film 104 constituted by any of these materials is hydrophobic. Further, even on the surface of a hydrophilic insulating film such as SiO, SiOP, SiOF and SiON, residual matters are enabled to adhere thereto after finishing the process of CMP. Even to such an insulating film, the treating liquid according to one embodiment of the present invention can be suitably applied.

The barrier metal film 105 and the wiring material film 106 are deposited on the aforementioned laminated insulating films having a wiring trench formed therein. The barrier metal film 105 may be deposited to a thickness of 10 nm using Ta. The wiring material film 106 may be deposited to a thickness of 400 nm using Cu.

Incidentally, in the example shown in FIG. 1A, although the insulating film on which the barrier metal film 105 and the wiring material film 106 are formed is constituted by a laminate structure comprising the first insulating film 103 and the second insulating film 104, this insulating film may be constituted by a single layer of insulating film. The insulating film in this case may be formed using black diamond (Applied Materials Co., Ltd.), etc. The surface of the insulating film formed of such a material is also hydrophobic.

Then, redundant portions of the barrier metal film 105 and the wiring material film 106 are removed by CMP, thereby exposing the surface of the second insulating film 104 as shown in FIG. 1B. In this CMP, the removal of the wiring material film 106 (1st polishing) and the removal of the barrier metal film 105 (2nd polishing) were performed in two steps, the conditions thereof being as shown below.

(1st polishing)
Slurry: CMS7401/7452 (JSR Co., Ltd.)
Flow rate: 300 cc/min.
Polishing pad: IC1000 (Nitta Harth Co., Ltd.)
Load: 300 gf/cm$^2$.

The rotational speeds of the carrier and the table were both set to 100 rpm and the polishing was performed for one minute.

(2nd polishing)

Slurry: CMS8401/8452 (JSR Co., Ltd.)
Flow rate: 200 cc/min.
Polishing pad: IC1000 (Nitta Harth Co., Ltd.)
Load: 300 gf/cm$^2$.

The rotational speeds of the carrier and the table were both set to 100 rpm and the polishing was performed for 30 seconds.

Residues such as abrasive grains 107, polished debris or products 108 and water mark 109 were found adhered to the surfaces of the second insulating film 104, the barrier metal film 105 and the wiring material film 106 immediately after the 2nd polishing as shown in FIG. 1B. The residues such as abrasive grains 107, polished debris 108 and water mark 109 adhered in this manner would become a cause for generating defects.

When these residues thus adhered are removed through the washing using the treating liquid according one embodiment of the present invention, clean surfaces can be obtained as shown in FIG. 1C.

It has been found out by the present inventors that the removal of water mark in particular among these adhered residues is greatly influenced by the features of the resin particles. Accordingly, the following experiments were performed to find out an optimum primary particle diameter and an optimum concentration of the resin particles.

As the resin particles, PMMA particles of various primary particle diameters were prepared. The surfaces of these various resin particles were provided, on their surfaces, with carboxyl group and sulfonyl group. Each of these resin particles was dispersed in pure water at various concentrations to prepare various dispersions (pH=4). Then, the removal of water mark was tried by these various dispersions.

More specifically, using each of these dispersions, the surface having the features as shown in FIG. 1B was washed. The washing was performed by contacting a polishing pad (Loadel Nitta Co., Ltd.) with the surface to be treated while feeding a treating liquid to the polishing pad under the following conditions, in which the surface to be treated was rubbed by the polishing pad for about 30 to 60 seconds.

Flow rate of treating liquid: 300 cc/min.
Load: 300 gf/cm$^2$.
Rotational speeds of the carrier and the table: both 100 rpm.

Since it would become difficult to remove the residues after the surface to be treated has been dried up, the washing should preferably be performed while the surface to be treated is kept in a wet state. Namely, the washing should preferably be performed successively immediately after finishing the 2nd polishing using the same apparatus.

Incidentally, it is also possible to employ washing with rolls or washing with pencil in place of or subsequent to the washing using a polishing pad.

Water mark on the insulating film and the residues of resin particles on the entire surface thus washed were investigated by a light field defective-measuring apparatus and the presence and absence of these mark and residues were determined according to the following criterion.

◯: These mark and residues were not recognized
Δ: Either mark or residues was recognized
X: These mark and residues were both recognized The results thus obtained are summarized in the following Table 1 together with the combination between the primary particle diameter and the concentration of the resin particles.

TABLE 1

| | | Primary particle diameter (nm) | | | | | | | |
|---|---|---|---|---|---|---|---|---|---|
| | | 5 | 8 | 10 | 30 | 50 | 60 | 80 | 100 |
| Concentration (wt %) | 1.4 | X | X | Δ | Δ | Δ | Δ | X | X |
| | 1.2 | X | X | Δ | Δ | Δ | Δ | X | X |
| | 1 | X | Δ | ◯ | ◯ | ◯ | ◯ | Δ | Δ |
| | 0.5 | X | Δ | ◯ | ◯ | ◯ | ◯ | Δ | Δ |
| | 0.1 | X | Δ | ◯ | ◯ | ◯ | ◯ | Δ | Δ |
| | 0.07 | X | Δ | ◯ | ◯ | ◯ | ◯ | Δ | Δ |
| | 0.05 | X | Δ | ◯ | ◯ | ◯ | ◯ | Δ | Δ |
| | 0.01 | X | Δ | ◯ | ◯ | ◯ | ◯ | Δ | Δ |
| | 0.005 | X | Δ | Δ | Δ | Δ | Δ | X | X |

As shown in above Table 1, in order to remove the water mark on the insulating film and to prevent the generation of residues of resin particles on the surface to be treated, the primary particle diameter of the resin particles should be confined within the range of 10 to 60 nm and the concentration of the resin particles should be confined within the range of 0.01 to 1 wt %.

Then, the first surfactant, the second surfactant and TMAH were mixed together to prepare a treating liquid according to one embodiment of the present invention. Using this treating liquid, the surface obtained after finishing the process of CMP was washed.

The treating liquid according to one embodiment of the present invention was prepared according to the following methods.

EXAMPLE 1

PMMA particles having, on their surfaces, carboxyl group and sulfonyl group (primary particle diameter: 50 nm) were prepared as resin particles and then dispersed in pure water at a concentration of 0.1 wt % to obtain a dispersion. Then, polyacrylic acid as the first surfactant and potassium dodecyl benzene sulfonate as the second surfactant were added to the dispersion. The concentration of these surfactants was both set to 0.2 wt %. Subsequently, 0.03 wt % of TMAH was added to the dispersion to prepare the treating liquid of Example 1. The pH of the treating liquid thus obtained was 4.

EXAMPLE 2

The treating liquid of Example 2 was prepared in the same manner as described in Example 1 except that the primary particle diameter of the resin particles was changed to 10 nm.

EXAMPLE 3

The treating liquid of Example 3 was prepared in the same manner as described in Example 1 except that the primary particle diameter of the resin particles was changed to 60 nm.

EXAMPLE 4

The treating liquid of Example 4 was prepared in the same manner as described in Example 1 except that the concentration of the resin particles was changed to 0.01 wt %.

EXAMPLE 5

The treating liquid of Example 5 was prepared in the same manner as described in Example 1 except that the concentration of the resin particles was changed to 0.5 wt %.

EXAMPLES 6-9

The treating liquids of Examples 6-9 were prepared in the same manner as described in Example 1 except that the pH was changed to 6, 7, 8 and 9, respectively. Incidentally, the pH was adjusted by increasing or decreasing the amount of the TMAH.

EXAMPLE 10

The treating liquid of Example 10 was prepared in the same manner as described in Example 1 except that the resin particles were changed to polystyrene.

EXAMPLE 11

The treating liquid of Example 11 was prepared in the same manner as described in Example 1 except that the resin particles were changed to polyethylene.

EXAMPLE 12

The treating liquid of Example 12 was prepared in the same manner as described in Example 1 except that the first surfactant was changed to potassium polyacrylate.

EXAMPLE 13

The treating liquid of Example 13 was prepared in the same manner as described in Example 1 except that the first surfactant was changed to ammonium polyacrylate.

EXAMPLE 14

The treating liquid of Example 14 was prepared in the same manner as described in Example 1 except that the second surfactant was changed to ammonium dodecyl benzene sulfonate.

EXAMPLE 15

The treating liquid of Example 15 was prepared in the same manner as described in Example 9 except that 0.1 wt % of hydroxylamine was further added as a reducing agent to the dispersion.

Using the treating liquids of Examples 1-15 thus obtained, the surface having the features as shown in FIG. 1B was washed. The washing was performed by contacting a polishing pad (Loadel Nitta Co., Ltd.) with the surface to be treated while feeding a treating liquid to the polishing pad under the following conditions, in which the surface to be treated was rubbed by the polishing pad for about 30 to 60 seconds.

Flow rate of treating liquid: 300 cc/min.

Load: 300 gf/cm$^2$.

Rotational speeds of the carrier and the table: both 100 rpm.

Further, the surface having the features as shown in FIG. 1B was washed in the same manner as described above except that the treating liquids described below were employed, these washing methods being designated as Comparative Examples 1 to 13. The treating liquids employed in these Comparative Examples were prepared in the same manner as described in above Example 1 except the changes made as follows.

COMPARATIVE EXAMPLE 1

Resin particles having no functional group on their surfaces were employed.

COMPARATIVE EXAMPLE 2

Resin particles having only carboxyl group on their surfaces were employed.

COMPARATIVE EXAMPLE 3

Resin particles having only sulfonyl group on their surfaces were employed.

COMPARATIVE EXAMPLE 4

The primary particle diameter of resin particles was changed to 8 nm.

COMPARATIVE EXAMPLE 5

The primary particle diameter of resin particles was changed to 100 nm.

COMPARATIVE EXAMPLE 6

The concentration of resin particles was changed to 0.005 wt %.

COMPARATIVE EXAMPLE 7

The concentration of resin particles was changed to 2 wt %.

COMPARATIVE EXAMPLE 8

The first surfactant was not incorporated.

COMPARATIVE EXAMPLE 9

The second surfactant was not incorporated.

COMPARATIVE EXAMPLE 10

TMAH was replaced by ethylene diamine.

COMPARATIVE EXAMPLE 11

TMAH was replaced by ethylene KOH.

COMPARATIVE EXAMPLE 12 pH was changed to 3.

COMPARATIVE EXAMPLE 13 pH was changed to 10.

Incidentally, in Examples 10 and 11, the pH was 4. Further, in Examples 12 and 13, the amount of TMAH was adjusted to control the pH thereof to a predetermined value, respectively.

After the washing treatment, the measurement of light field defectives in a region (174.25 cm$^2$/wafer) on a pattern wafer was performed and at the same time, the yield with respect to the short-circuit between wirings was measured. As the kinds of defects assessed herein, they included dust and scratches observed generally after the CMP thereof in addition to the water mark on the insulating film and the residues of resin particles remaining on the entire surface thus treated. Incidentally, the dust and scratches were investigated throughout the entire surface thus treated. The results obtained are summarized in the following Tables 2 and 3.

TABLE 2

| Examples | Number of defects | Yield in wiring short-circuit (%) |
|---|---|---|
| 1 | 1 | 94 |
| 2 | 2 | 95 |
| 3 | 1 | 97 |
| 4 | 0 | 91 |
| 5 | 2 | 92 |
| 6 | 5 | 95 |
| 7 | 3 | 98 |
| 8 | 2 | 99 |
| 9 | 0 | 98 |
| 10 | 3 | 95 |
| 11 | 4 | 99 |
| 12 | 2 | 94 |
| 13 | 1 | 99 |
| 14 | 0 | 98 |
| 15 | 1 | 97 |

TABLE 3

| Comp. Examples | Number of defects | Yield in wiring short-circuit (%) |
|---|---|---|
| 1 | 562 | 76 |
| 2 | 63 | 85 |
| 3 | 69 | 81 |
| 4 | 165 | 79 |
| 5 | 80 | 81 |
| 6 | 120 | 74 |
| 7 | 453 | 75 |
| 8 | 46 | 82 |
| 9 | 22 | 87 |
| 10 | 8 | 69 |
| 11 | 82 | 88 |
| 12 | 74 | 72 |
| 13 | 66 | 83 |

As shown in Table 2, when the washing was performed using treating liquids (Examples 1-15) each comprising resin particles having two kinds of functional groups and a predetermined range of primary particle diameter and a predetermined range of concentration; the first and second surfactants; and TMAH; the pH thereof falling within the range of 4 to 9, it was possible to improve the semiconductor device in terms of the number of defectives and electric properties. More specifically, the number of defects was 5 or less and the yield with respect to the short-circuit between wirings was increased up to 90% or more. As long as the number of defects is confined to not more than 9, it is considered acceptable. With regard to the yield with respect to the short-circuit between wirings, it is demanded to be 90% or more. The defects acceptable herein are consisted of dust and scratches.

Incidentally, in every examples, the polishing rate of the wiring material film 106 was about 1 nm/min and the polishing rate of the second insulating film 104 was about 1 nm/min.

In view of these results, it was assumed that when the treating liquid was constructed as represented by these Examples, it was possible to effectively remove residues through mechanical action without imposing excessive loads on a hydrophobic fragile insulating film of low dielectric constant. Especially, it was possible to effectively remove even the water mark that may generate on the surface of insulating film and bring about the deterioration of electric properties. It was also possible to prevent the generation of scratches.

Whereas, in the cases of the treating liquids of Comparative Examples, they were all incapable of suppressing the generation of defects and hence incapable of enhancing the yield with respect to the short-circuit between wirings. More specifically, when none of the functional groups were existed on the surface of the resin particles (Comparative Example 1), a great number of defects generated. The reason for this may be attributed to the fact that water mark was not removed at all. Even in the cases where only one kind of functional group was existed on the surface of resin particles (Comparative Examples 2 and 3), it was impossible to reduce the number of defects to an acceptable level.

In the case where the primary diameter of the resin particles was too small (Comparative Example 4), it was impossible to sufficiently exhibit washing effects and hence to remove water mark. On the other hand, in the case where the primary diameter of the resin particles is too large (Comparative Example 5), the resin particles remained, thus generating defects. In the case where the concentration of the resin particles is too low (Comparative Example 6), it was impossible to remove water mark due to the fact that the effects of the functional groups existing on the surfaces of the resin particles were negligible. In the case where the concentration of the resin particles is too high (Comparative Example 7), the resin particles themselves were permitted to remain, thus generating defects.

In the cases where only either one of the first surfactant and the second surfactant was incorporated in the treating liquid (Comparative Examples 8 and 9), it was impossible to reduce the number of defects to an acceptable level and the yield with respect to the short-circuit between wirings was also small.

In the case where TMAH was replaced by another basic compound (Comparative Example 10), the surface of wiring layer was roughened, thus degrading the yield with respect to the short-circuit between wirings.

In the case where TMAH was not included and only the pH thereof was adjusted (Comparative Example 11), it was impossible to reduce the number of defects to an acceptable level.

In the cases where the pH thereof was less than 4 or higher than 9 even though all of predetermined components were incorporated in the treating liquid (Comparative Examples 12 and 13), the number of defects was increased and the yield with respect to the short-circuit between wirings was also low.

In view of the results as described above, it was confirmed that a treating liquid comprising resin particles having two kinds of functional groups and a predetermined range of primary particle diameter and a predetermined range of concentration; specific kinds of the first and second surfactants; and TMAH; the pH thereof falling within the range of 4 to 9, was capable of exhibiting excellent effects. Namely, the treating liquid according to the embodiment of the present invention exhibits prominent effects in the removal of the water mark which is inherent to an insulating film having low dielectric constant and is also capable of concurrently removing polished debris or products such as the residues of abrasive grains, dust, complex, etc.

Although various embodiments of the present invention are explained with reference to examples of post-treatment after finishing the process of Cu-CMP, it should be construed that the present invention is not confined to these examples. The treating liquid comprising the resin particles can be applied likewise to the formation of buried electrodes, wirings and plugs where Al, W and polysilicon are employed, thus obtaining almost the same effects as described above. Further, the treating liquid of the embodiment of the present invention can be also applied to the post-treatment after CMP of SiO$_2$ employed as an insulating film to be formed on the wiring layer, making it possible to effectively wash it to obtain a clean surface thereof.

According to the embodiment of the present invention, it is possible to provide a post-CMP treating liquid which is capable of effectively removing the residues adhered onto the surfaces of wiring layer and insulating layer and also to provide a method for manufacturing a semiconductor device using this post-CMP treating liquid.

According to the present invention, it is possible to manufacture a semiconductor device having high performance and high speed, which is provided with a wiring having a design rule of 0.05 μm or less which is required in a semiconductor device of the next generation, thus presenting enormous industrial values.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising:
    depositing a conductive material above an insulating film formed above a semiconductor substrate and having a recess, thereby forming a conductive film;
    polishing the conductive film to expose a surface of the insulating film while burying the conductive material in the recess, thereby forming a buried wiring layer; and
    treating a surface of the buried wiring layer and the surface of the insulating film using a treating liquid without substantially polishing these surfaces, the treating liquid comprising water; resin particles having, on their surfaces, carboxylic group and sulfonyl group, and a primary particle diameter ranging from 10 to 60 nm, the resin particles being incorporated at a concentration ranging from 0.01 to 1 wt %; a first surfactant having a carboxylic group; a second surfactant having a sulfonyl group; and tetramethyl ammonium hydroxide; the treating liquid having a pH ranging from 4 to 9.

2. The method according to claim 1, wherein the insulating film is formed of an insulating material selected from the group consisting of SiC, SiCH, SiCN, SiOC, SiN and SiOCH.

3. The method according to claim 1, wherein the conductive film comprises a barrier metal film and a Cu film.

4. The method according to claim 1, wherein the resin particles in the treating liquid are formed of at least one selected from the group consisting of poly(methyl methacrylate), polystyrene, polyethylene, polyethylene glycol, polyvinyl acetate, polybutadiene, polyisobutylene, polypropylene and polyoxymethylene.

5. The method according to claim 1, wherein the first surfactant in the treating liquid is selected from the group consisting of polyacrylic acid, polyacrylate, polymethacrylic acid, polymethacrylate, acrylic acid-methacrylic acid and acrylic acid-ethacrylate.

6. The method according to claim 1, wherein the first surfactant in the treating liquid has a weight average molecular weight ranging from 2000 to 20000.

7. The method according to claim 1, wherein the first surfactant is incorporated in the treating liquid at an amount ranging from 0.01 to 1 wt % based on a total weight of the treating liquid.

8. The method according to claim 1, wherein the second surfactant in the treating liquid is selected from the group consisting of hexyl benzene sulfonate, octyl benzene sulfonate, dodecyl benzene sulfonate, tetradecyl benzene sulfonate, hexadecyl benzene sulfonate and octadecyl benzene sulfonate.

9. The method according to claim 1, wherein the second surfactant is incorporated in the treating liquid at an amount ranging from 0.01 to 1 wt % based on a total weight of the treating liquid.

* * * * *